US011460323B2

(12) United States Patent
Schmitt et al.

(10) Patent No.: US 11,460,323 B2
(45) Date of Patent: Oct. 4, 2022

(54) MAGNETIC FIELD SENSOR PACKAGE

(71) Applicant: Analog Devices International Unlimited Company, Limerick (IE)

(72) Inventors: Jochen Schmitt, Biedenkopf (DE); Michael J. Cusack, Newmarket-on-Fergus (IE); Enda Joseph Nicholl, Kilmallock (IE); Brian O'Mara, Lisnagry (IE)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 17/169,180

(22) Filed: Feb. 5, 2021

(65) Prior Publication Data
US 2022/0252427 A1 Aug. 11, 2022

(51) Int. Cl.
*G01D 5/16* (2006.01)
*H01L 43/02* (2006.01)
(Continued)

(52) U.S. Cl.
CPC ............. *G01D 5/16* (2013.01); *G01R 33/093* (2013.01); *G01R 33/096* (2013.01);
(Continued)

(58) Field of Classification Search
CPC ...... G01R 33/096; G01R 33/098; H01L 43/02
See application file for complete search history.

(56) References Cited

U.S. PATENT DOCUMENTS 3,538,762 A 11/1970 Parkinson et al.
4,506,217 A 3/1985 Rothley et al.
(Continued)

FOREIGN PATENT DOCUMENTS

CN 108844557 11/2018
CN 114301239 4/2022
(Continued)

OTHER PUBLICATIONS

Loreit et al., "Novel magnetoresistive length measuring elements and length measurement concept for nm resolutions," Magnetoresistive Sensoren II, 2nd Symposium on Magnetoresistive Sensors and Magnetic Systems, Wetzlar, Germany (Mar. 18, 1993), pp. 87-97.
(Continued)

*Primary Examiner* — Alvaro E Fortich
(74) *Attorney, Agent, or Firm* — Knobbe, Martens, Olson & Bear, LLP

(57) ABSTRACT

A magnetic field sensor package is disclosed. The package includes a substrate that has a front side and a back side opposite the front side. The substrate can comprise a lead frame. The package also includes a first magnetic field sensor die that is electrically and mechanically mounted on the front side of the substrate. The package also includes a second magnetic field sensor die that is electrically and mechanically mounted on the front side of the substrate. The package further includes a magnet that is disposed on the back side of the substrate. The magnet can provide a bias field for the first magnetic field sensor die and the second magnetic field sensor die. The package can also include a molding material that is disposed about the lead frame, the first magnetic field sensor die, the second magnetic field sensor die, and the magnet.

20 Claims, 14 Drawing Sheets

(51) Int. Cl.
*H01L 43/08* (2006.01)
*G01R 33/09* (2006.01)
*B62D 5/04* (2006.01)
*H02K 11/215* (2016.01)

(52) U.S. Cl.
CPC ............ *G01R 33/098* (2013.01); *H01L 43/02* (2013.01); *H01L 43/08* (2013.01); *B62D 5/046* (2013.01); *H02K 11/215* (2016.01)

(56) References Cited

U.S. PATENT DOCUMENTS

| | | | |
|---|---|---|---|
| 4,724,710 | A | 2/1988 | Murty |
| 5,200,747 | A | 4/1993 | Betz et al. |
| 5,359,287 | A | 10/1994 | Watanabe et al. |
| 5,930,905 | A | 8/1999 | Zabler et al. |
| 6,047,605 | A | 4/2000 | Garshelis |
| 6,291,989 | B1 | 9/2001 | Schroeder |
| 6,363,797 | B1 | 4/2002 | Tokumoto et al. |
| 6,366,079 | B1 | 4/2002 | Uenoyama |
| 6,439,067 | B1 | 8/2002 | Goldman et al. |
| 6,466,889 | B1 | 10/2002 | Schödlbauer |
| 6,498,482 | B2 | 12/2002 | Schroeder |
| 6,515,571 | B2 | 2/2003 | Takeda |
| 6,543,571 | B2 | 4/2003 | Tokumoto |
| 6,871,555 | B2 | 3/2005 | May |
| 6,924,639 | B2 | 8/2005 | Uenoyama |
| 6,941,241 | B2 | 9/2005 | Lee et al. |
| 6,973,991 | B2 | 12/2005 | Tokumoto et al. |
| 6,978,685 | B2 | 12/2005 | Shiba et al. |
| 6,981,423 | B1 | 1/2006 | Discenzo |
| 6,988,421 | B2 | 1/2006 | Tokumoto |
| 7,028,545 | B2 | 4/2006 | Gandel et al. |
| 7,089,809 | B2 | 8/2006 | Nakane et al. |
| 7,174,795 | B2 | 2/2007 | Feng et al. |
| 7,215,112 | B1 | 5/2007 | Recio et al. |
| 7,259,551 | B2 | 8/2007 | Mock et al. |
| 7,635,974 | B2 | 12/2009 | Guo et al. |
| 7,856,338 | B2 | 12/2010 | Maone et al. |
| 7,923,993 | B2 | 4/2011 | Takahashi et al. |
| 8,018,224 | B2 | 9/2011 | Kurumado |
| 8,024,956 | B2 | 9/2011 | Granig et al. |
| 8,289,019 | B2 | 10/2012 | Koller et al. |
| 8,575,920 | B2 | 11/2013 | Ausserlechner |
| 8,754,640 | B2 | 6/2014 | Vig et al. |
| 8,766,623 | B2 | 7/2014 | Ausserlechner et al. |
| 8,890,514 | B2 | 11/2014 | Masson et al. |
| 9,070,873 | B2 | 6/2015 | Herbst |
| 9,322,887 | B1 | 4/2016 | Eagen et al. |
| 9,347,799 | B2 | 5/2016 | Nazarian et al. |
| 9,379,598 | B2 | 6/2016 | Someya et al. |
| 9,429,632 | B2 | 8/2016 | Kawano et al. |
| 9,470,506 | B2 | 10/2016 | Schaffer |
| 9,475,520 | B2 | 10/2016 | Yanai et al. |
| 9,719,771 | B2 | 8/2017 | Ausserlechner |
| 9,719,806 | B2 | 8/2017 | Foletto et al. |
| 9,823,092 | B2 | 11/2017 | David et al. |
| 9,857,438 | B2 | 1/2018 | Werth |
| 9,933,323 | B2 | 4/2018 | Schweizer et al. |
| 9,999,107 | B1* | 6/2018 | Rivas ...................... G01D 7/00 |
| 10,049,969 | B1* | 8/2018 | Liu ...................... H01L 25/0652 |
| 10,060,941 | B2 | 8/2018 | Bai et al. |
| 10,126,147 | B2 | 11/2018 | Fujita |
| 10,155,532 | B2 | 12/2018 | Farrelly |
| 10,254,303 | B2 | 4/2019 | Grambichler et al. |
| 10,274,507 | B2 | 4/2019 | Binder |
| 10,338,158 | B2 | 7/2019 | Werth et al. |
| 10,338,159 | B2 | 7/2019 | Ausserlechner |
| 10,473,679 | B2 | 11/2019 | Fontanesi et al. |
| 10,495,485 | B2 | 12/2019 | Burdette et al. |
| 10,605,874 | B2 | 3/2020 | Lassalle-Balier et al. |
| 10,613,113 | B2 | 4/2020 | Hashimoto et al. |
| 10,627,261 | B2 | 4/2020 | Imai |
| 10,656,170 | B2 | 5/2020 | Lim et al. |
| 10,732,194 | B2 | 8/2020 | Hainz et al. |
| 10,816,318 | B2 | 10/2020 | Vandersteegen et al. |
| 10,816,363 | B2 | 10/2020 | Ruigrok et al. |
| 10,830,613 | B2 | 11/2020 | Tonge et al. |
| 10,837,848 | B2 | 11/2020 | Janisch et al. |
| 10,859,404 | B2 | 12/2020 | Diegel et al. |
| 10,859,406 | B2 | 12/2020 | Richard et al. |
| 10,866,122 | B2 | 12/2020 | Weiland et al. |
| 10,962,386 | B2 | 3/2021 | Mattheis et al. |
| 2002/0035877 | A1 | 3/2002 | Tokumoto |
| 2003/0145663 | A1 | 8/2003 | Heisenberg et al. |
| 2003/0173955 | A1 | 9/2003 | Uenoyama |
| 2004/0083823 | A1 | 5/2004 | Tokumoto |
| 2007/0200564 | A1 | 8/2007 | Motz et al. |
| 2008/0250873 | A1 | 10/2008 | Prudham et al. |
| 2009/0315544 | A1 | 12/2009 | Takahashi et al. |
| 2012/0056615 | A1* | 3/2012 | Ausserlechner ... G01R 33/1207 324/202 |
| 2012/0260746 | A1 | 10/2012 | Lee |
| 2013/0169270 | A1 | 7/2013 | Delbaere et al. |
| 2013/0241544 | A1 | 9/2013 | Zimmer |
| 2013/0305843 | A1 | 11/2013 | Lee et al. |
| 2013/0335072 | A1* | 12/2013 | Malzfeldt ............... G01D 5/145 324/207.21 |
| 2015/0022192 | A1 | 1/2015 | Ausserlechner |
| 2015/0331069 | A1 | 11/2015 | Ausserlechner |
| 2017/0137054 | A1 | 5/2017 | Farrelly |
| 2017/0167897 | A1 | 6/2017 | Lackermaier et al. |
| 2017/0219383 | A1 | 8/2017 | Umehara et al. |
| 2017/0248445 | A1* | 8/2017 | Ausserlechner ..... G01D 5/2006 |
| 2017/0276740 | A1 | 9/2017 | Schmitt et al. |
| 2017/0314907 | A1* | 11/2017 | Taylor .................... G01D 5/147 |
| 2018/0313912 | A1 | 11/2018 | David et al. |
| 2019/0120914 | A1 | 4/2019 | Hammerschmidt et al. |
| 2019/0242764 | A1 | 8/2019 | Nicholl et al. |
| 2019/0331541 | A1 | 10/2019 | Janisch et al. |
| 2020/0004131 | A1 | 2/2020 | Lassalle-Baller et al. |
| 2020/0386576 | A1* | 12/2020 | Hammerschmidt . G01R 15/202 |
| 2022/0115932 | A1 | 4/2022 | Schmitt et al. |

FOREIGN PATENT DOCUMENTS

| | | |
|---|---|---|
| DE | 197 22 834 | 12/1998 |
| DE | 102005009923 | 9/2006 |
| DE | 102005018286 | 10/2006 |
| DE | 102007029819 | 2/2012 |
| DE | 102008039331 | 1/2015 |
| DE | 102018214296 | 2/2019 |
| DE | 102017124542 | 4/2019 |
| DE | 102019104895 | 9/2019 |
| EP | 1 353 151 | 10/2003 |
| EP | 1403173 | 12/2006 |
| EP | 3599714 A1 | 1/2020 |
| JP | 61-247568 | 11/1986 |
| JP | 8-320327 | 12/1996 |
| JP | 2004-117114 | 4/2004 |
| JP | 2004-245642 | 9/2004 |
| JP | 2006-119082 | 5/2006 |
| JP | 2007-285741 | 11/2007 |
| JP | 4737372 | 7/2011 |
| WO | WO 2002/071019 | 9/2002 |
| WO | WO 2005/076860 | 8/2005 |
| WO | WO 2008/101702 | 8/2008 |
| WO | WO 2012/010507 A1 | 1/2012 |

OTHER PUBLICATIONS

Stritzke et al., "Highly flexible absolute integrated encoder system on GMR-basis", pp. 132-137 (2013).
TLE5x09A16 (D) Analog AMR/GMR Angle Sensors data sheet. (Dec. 2018).

* cited by examiner

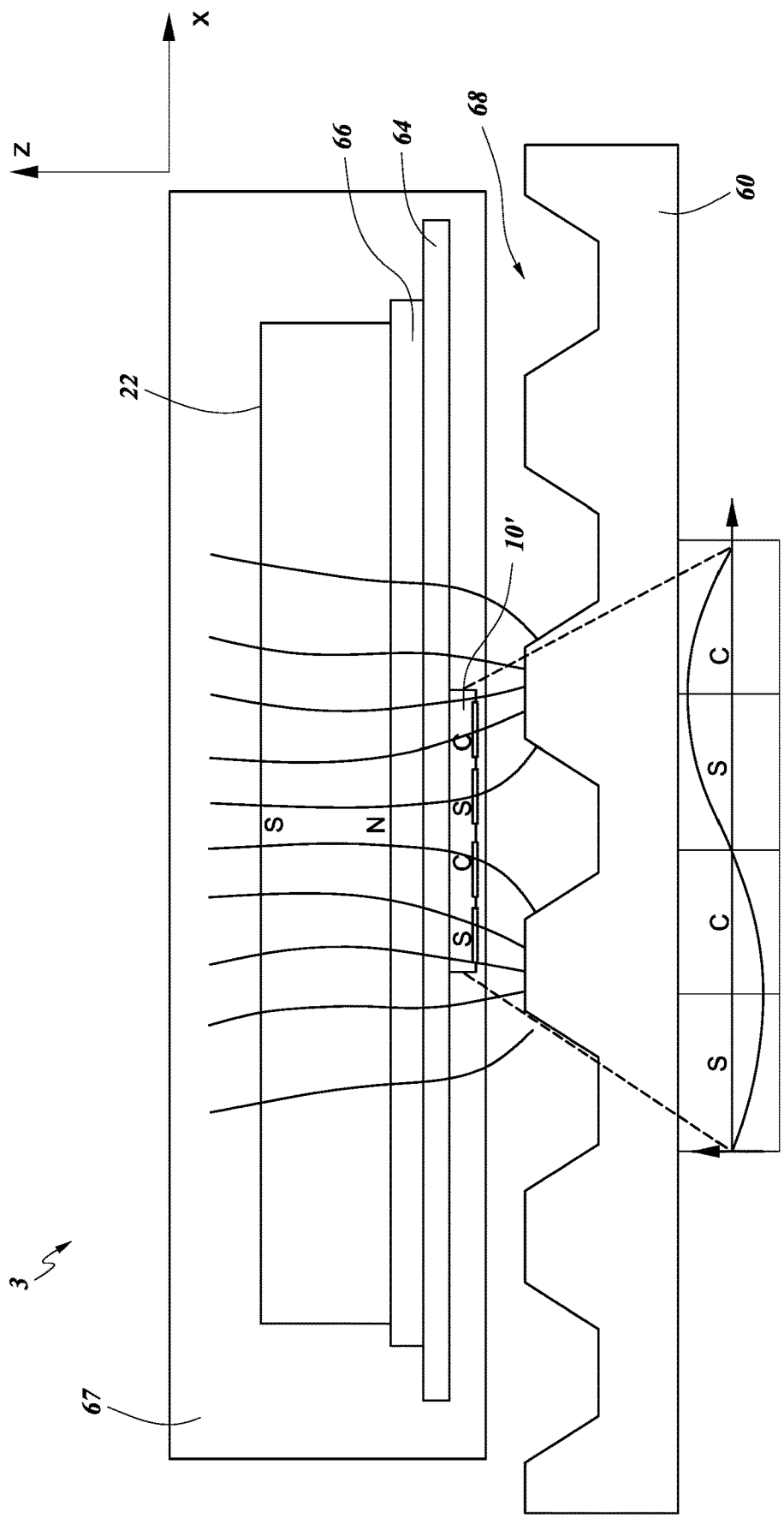

MAGNETIC FIELD SENSOR PACKAGE

BACKGROUND

Field

The disclosure relates to magnetic field sensor packages and, in particular, to a back biased magnetic differential field or angle sensor packages.

Description of the Related Art

A magnetic field sensor can include Anisotropic Magneto Resistive (AMR) sensor elements, Giant Magneto Resistive (GMR) sensor elements, any type of magnetoresistive sensing elements (xMR), Tunnel Magneto Resistive sensor elements, or other suitable technologies. A biasing magnet can be used in the magnetic field sensor to bias sensing elements of the magnetic field sensor.

The magnetic field sensor can comprise a turn counter. In an automotive context, the turn counter may indicate how many times a wheel has been rotated, and/or an angle of the wheel rotated.

SUMMARY

In one aspect, a magnetic field sensor package is disclosed. The magnetic field sensor package can include a lead frame that has a front side and a back side opposite the front side. The magnetic field sensor package can include a first magnetic field sensor die that is mounted on the front side of the lead frame. The first magnetic field sensor die has a first half bridge and a second half bridge. The first half bridge is configured to provide a first output signal and the second half bridge is configured to provide a second output signal. The magnetic field sensor package can include a second magnetic field sensor die that is mounted on the front side of the lead frame and spaced apart from the first magnetic field sensor along the front side of the lead frame. The second magnetic field sensor die has a third half bridge and a fourth half bridge. The third half bridge is configured to provide a third output signal and the fourth half bridge is configured to provide a fourth output signal. The magnetic field sensor package can include a magnet that is disposed on the back side of the lead frame. The magnet provides a bias field for the first magnetic field sensor die and the second magnetic field sensor die.

In one embodiment, the first half bridge includes a first magnetoresistive element and a second magnetoresistive element, the second half bridge comprises a third magnetoresistive element and a fourth magnetoresistive element, the third half bridge comprises a fifth magnetoresistive element and a sixth magnetoresistive element, and the fourth half bridge comprises a seventh magnetoresistive element and an eighth magnetoresistive element arranged.

In one embodiment, the first magnetic field sensor die is configured to be positioned between the magnet and a first target object, and the first magnetic field sensor die is configured to measure a magnetic field disturbance caused by the first target object. The second magnetic field sensor die can be configured to be positioned between the magnet and a second target object, and the second magnetic field sensor die can be configured to measure a magnetic field disturbance caused by the second target object.

In one embodiment, the magnetic field sensor package further includes a molding material that is disposed about the lead frame, the first magnetic field sensor die, the second magnetic field sensor die, and the magnet.

In one embodiment, the magnetic field sensor package further includes an application specific integrated circuit (ASIC) die that is mounted on the front side of the lead frame and in electrical communication with the first magnetic field sensor die.

In one embodiment, the magnetic field sensor package further includes a spacer that is disposed between the magnet and the back side of the lead frame.

In one embodiment, at least a portion of the first magnetic field sensor die and at least a portion of the second magnetic field sensor die are positioned within a footprint of the magnet.

In one embodiment, the first magnetic field sensor die includes a giant magnetoresistance (GMR) sensor, a tunnel magnetoresistance (TMR) sensor, or an anisotropic magnetoresistance (AMR) sensor.

In one embodiment, the first magnetic field sensor die and the magnet are vertically separated at least in part by the lead frame. The first magnetic field sensor die can be horizontally offset relative to a center of the magnet. The magnet can be arranged such that a north pole and a south pole of the magnet are vertically aligned.

In one aspect, a magnetic field sensor package is disclosed. The magnetic field sensor package can include a substrate that has a front side and a back side opposite the front side. The magnetic field sensor package can include a first magnetic field sensor die that is mounted on the front side of the substrate and electrically connected to the substrate. The first magnetic field sensor die has a first magnetoresistive element and a second magnetoresistive element is arranged as a first half bridge. The first magnetic field sensor is configured to sense a first magnetic field disrupted at least in part by a first target object. The magnetic field sensor package can include a second magnetic field sensor die that is mounted on the front side of the substrate and electrically connected to the substrate. The second magnetic field sensor die has a third magnetoresistive element and a fourth magnetoresistive element arranged as a second half bridge. The second magnetic field sensor is configured to sense a second magnetic field disrupted at least in part by a second target object. The magnetic field sensor package can include a magnet that is disposed on the back side of the substrate. The magnet that provides a bias field for the first magnetic field sensor die and the second magnetic field sensor die, and an excitation field for the first and second target objects. The magnetic field sensor package can include a molding material that is disposed about at least portions of the substrate, the first magnetic field sensor die, the second magnetic field sensor die, and the magnet.

In one embodiment, the substrate includes a lead frame.

In one embodiment, the magnetic field sensor package further includes an application specific integrated circuit (ASIC) die that is mounted on the front side of the substrate and in electrical communication with the first magnetic field sensor die.

In one embodiment, at least a portion of the first magnetic field sensor die and at least a portion of the second magnetic field sensor die are positioned within a footprint of the magnet.

In one embodiment, the first magnetic field sensor die and the magnet are vertically spaced at least in part by the substrate. The first magnetic field sensor die can be horizontally offset relative to a center of the magnet, and the magnet can be arranged such that a north pole and a south pole of the magnet are vertically aligned.

In one embodiment, at least a portion of the magnet is free from the molding material.

In one aspect, a magnetic position measurement system is disclosed. the magnetic position measurement system can include a first target object, a second target object that is disposed adjacent to the first target object, and a magnetic field sensor package. The magnetic field sensor package can include a substrate that has a front side and a back side opposite the front side, a first magnetic field sensor die that is mounted on the front side of the substrate, a second magnetic field sensor die that is mounted on the front side of the substrate, and a magnet that is disposed on the back side of the substrate. The magnet provides a bias field for the first magnetic field sensor die and the second magnetic field sensor die and an excitation field for the first target object and the second target object. The first magnetic field sensor die is positioned between the magnet and the first target object, and the first magnetic field sensor die is configured to measure a magnetic field disturbance caused by the first target object. The second magnetic field sensor die is positioned between the magnet and the second target object, and the second magnetic field sensor die is configured to measure a magnetic field disturbance caused by the second target object.

In one embodiment, the sensor system includes processing electronics that are configured to determine an absolute position of the first target object and the second target object using a Nonius or Vernier algorithm.

In one embodiment, the magnetic field sensor package further includes an application specific integrated circuit (ASIC) die that is mounted on the front side of the substrate and in electrical communication with the first magnetic field sensor die. A molding material can be disposed about the ASIC die, and the substrate comprises a lead frame.

BRIEF DESCRIPTION OF THE DRAWINGS

FIG. 4B is a schematic cross sectional side view of the sensor system of FIG. 4A taken along an xz-plane in a first state.

DETAILED DESCRIPTION

Figure 1:
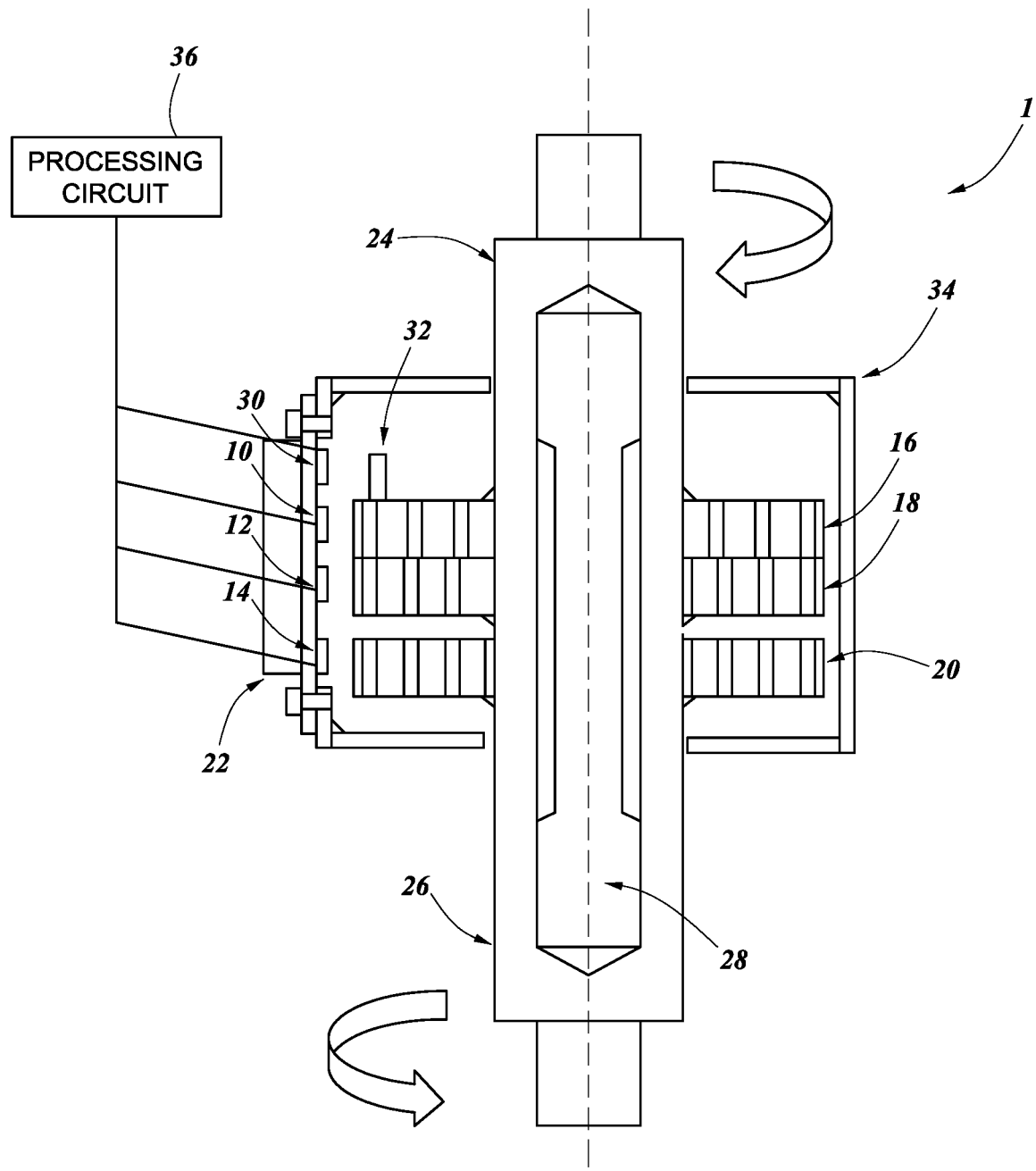
FIG. 1 is a schematic diagram of a magnetic sensor system.

Various embodiments disclosed herein relate to magnetic field sensor packages that include a sensor and a magnet therein. Magnetic sensor systems can include a magnetic field sensor. The magnetic sensor systems can measure, for example, torque, angle of rotation, and turn count of target objects. FIG. 1 is a schematic diagram of a magnetic sensor system 1 for measuring torque, angle of rotation, and turn count of a pair of coupled shafts. The magnetic sensor system 1 can include magnetic field sensors 10, 12, and 14 for measuring torque, position, absolute angle, and/or turn count of magnetic targets 16, 18, and 20, a bias magnet 22, first and second shaft portions 24, 26 that are coupled together via a torsion element 28, a magnetic sensor 30 and a magnetic feature 32, a sensor module 34, and a processing circuit 36.

The magnetic targets 16, 18, 20 can comprise gears. The magnetic feature 32 can be included on one of the magnetic targets 16, 18, 20. The magnetic targets 16, 18 may be rigidly mounted to the first shaft portion 24 and the magnetic target 20 may be mounted to the second shaft portion 26. The magnetic target 16 can have a different number of teeth than the magnetic target 18. For example, the magnetic target 18 can have n teeth and the magnetic target 16 may have n−1 or n+1 teeth.

The processing circuit 36 may be disposed within, adjacent to, or remotely away from the sensor module 34 and may receive signal(s) from magnetic sensors 10, 12, 14, 30. The processing circuit 36 can convert signals from the magnetic sensors into shaft turn count, shaft rotation angle, and/or torque measurements.

The system 1 utilizes a biasing magnet, such as the biasing magnet 22, and magnetic targets that distort, alter, modify, or otherwise change magnetic fields from the biasing magnet, which may have advantages over a similar system using magnetic targets that are permanently magnetized and that themselves produce magnetic fields. For example, a suitable biasing magnetic and magnetic targets that distort magnetic fields generated by a biasing magnet may be relatively inexpensive compared to permanently magnetized magnetic targets that produce suitable magnetic fields. In other words, systems utilizing magnetically active targets may be more expensive to provide and less reliable than systems utilizing magnetically passive targets, which merely distort, alter, modify, or otherwise change magnetic fields passing near or through the magnetically passive targets.

The system 1 may include more than one bias magnet. For example, the magnetic sensor systems disclosed herein may be provided with one bias magnet per magnetic target or feature. For another example, the magnetic sensor systems disclosed herein may be provided with multiple bias magnets, at least one of which produces magnetic fields that are distorted or otherwise influenced by two or more magnetic targets or features, with such distortions being detected by two or more magnetic sensors.

The magnetic field sensors 10, 12, 14, 30 can comprise Anisotropic Magneto Resistive (AMR) sensor elements, Giant Magneto Resistive (GMR) sensor elements, any magnetoresistive sensing elements (xMR), Tunnel Magneto Resistive sensor elements, or other suitable technologies. The sensors 10, 12, 14, 30 may provide Sine and Cosine outputs.

The sensor module 34 can include one or more sensors and one or more targets that are configured to measure the angle of rotation of the assembly (e.g., the rotation position between 0° and 360° of the first shaft portion 24 and/or the second shaft portion 26). For example, the magnetic targets 16, 18 (e.g., gears) may be affixed to the first shaft portion 24 and may rotate together with rotation of the first shaft portion 24. In addition, magnetic target 16 may have more or fewer teeth than magnetic target 18. For example, the magnetic target 18 may have n teeth, while the magnetic target 16 may have n−1 or n+1 teeth. In such an example, the Nonius principle applies and the absolute angle of rotation of the magnetic targets 16, 18 can be inferred by measuring the relative displacement of teeth on the magnetic target 16 with teeth on the magnetic target 18 at the position of sensors 10, 12. In particular, when the magnetic targets 16, 18 differ in number of teeth by one, the relative offset between adjacent teeth of the magnetic targets 16, 18 at the position of the magnetic sensors 10, 12 uniquely varies for an entire rotation of the first shaft portion 24. Thus, by comparing measurements from sensors 10, 12, the absolute angle of rotation of the first shaft portion 24, between 0° and 180°, can be measured.

Figure 2:
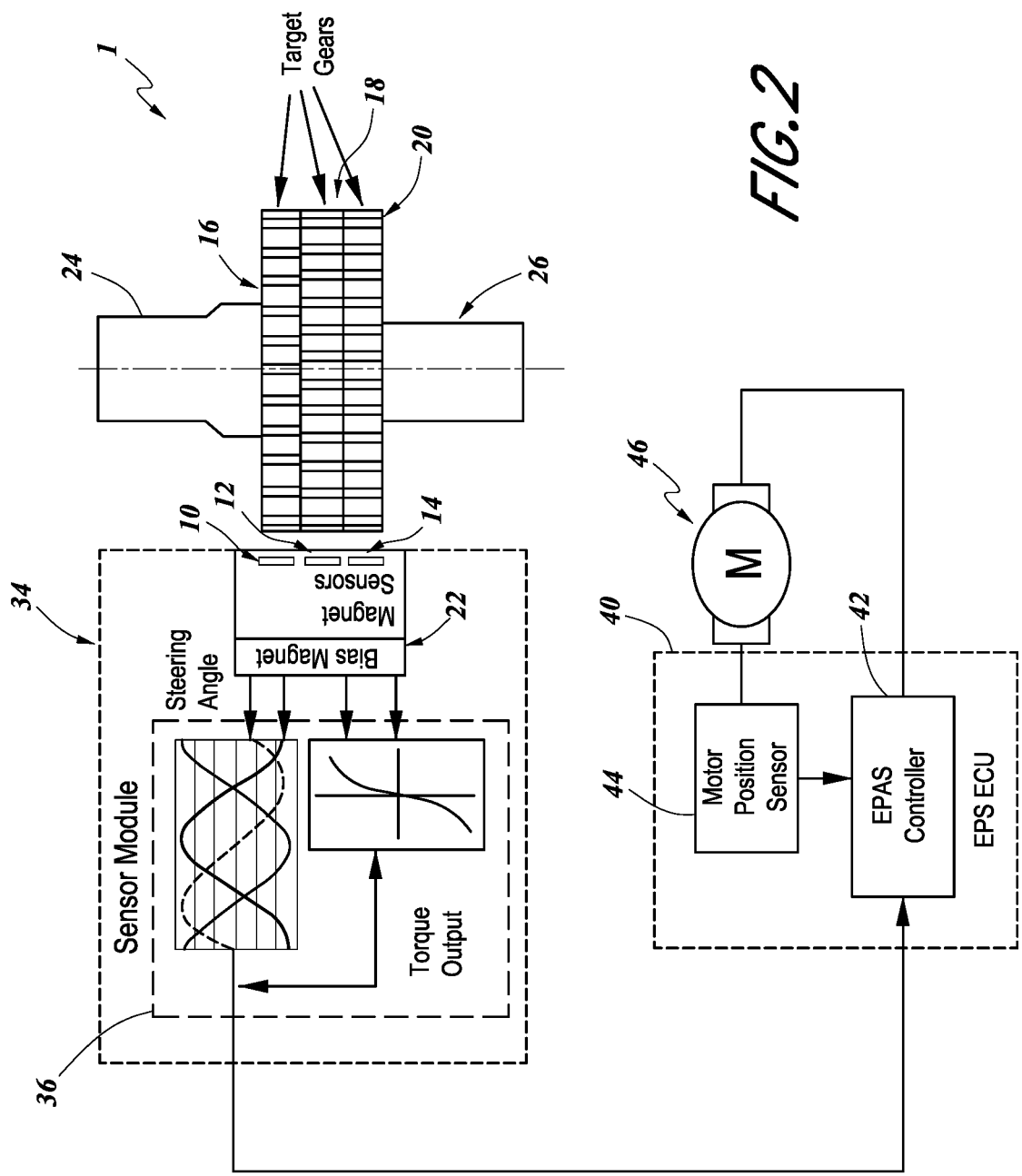
FIG. 2 is a system diagram of the magnetic sensor system of FIG. 1 coupled to an electric power steering (EPS) electronic control unit (ECU).

FIG. 2 is a system diagram of the system 1 coupled to an electric power steering (EPS) electronic control unit (ECU) 40. The EPS ECU 40 can include an EPAS controller 42 that can control an electric assist motor 46, and a motor position sensor 44. As shown in FIG. 2, the processing circuit 36 of the system 1 can receive signals from the magnetic sensors 10, 12, 14, calculate torque and steering angle, and transmit the measured torque and steering angle to the EPS ECU 40 or to another desired component.

Figure 3:
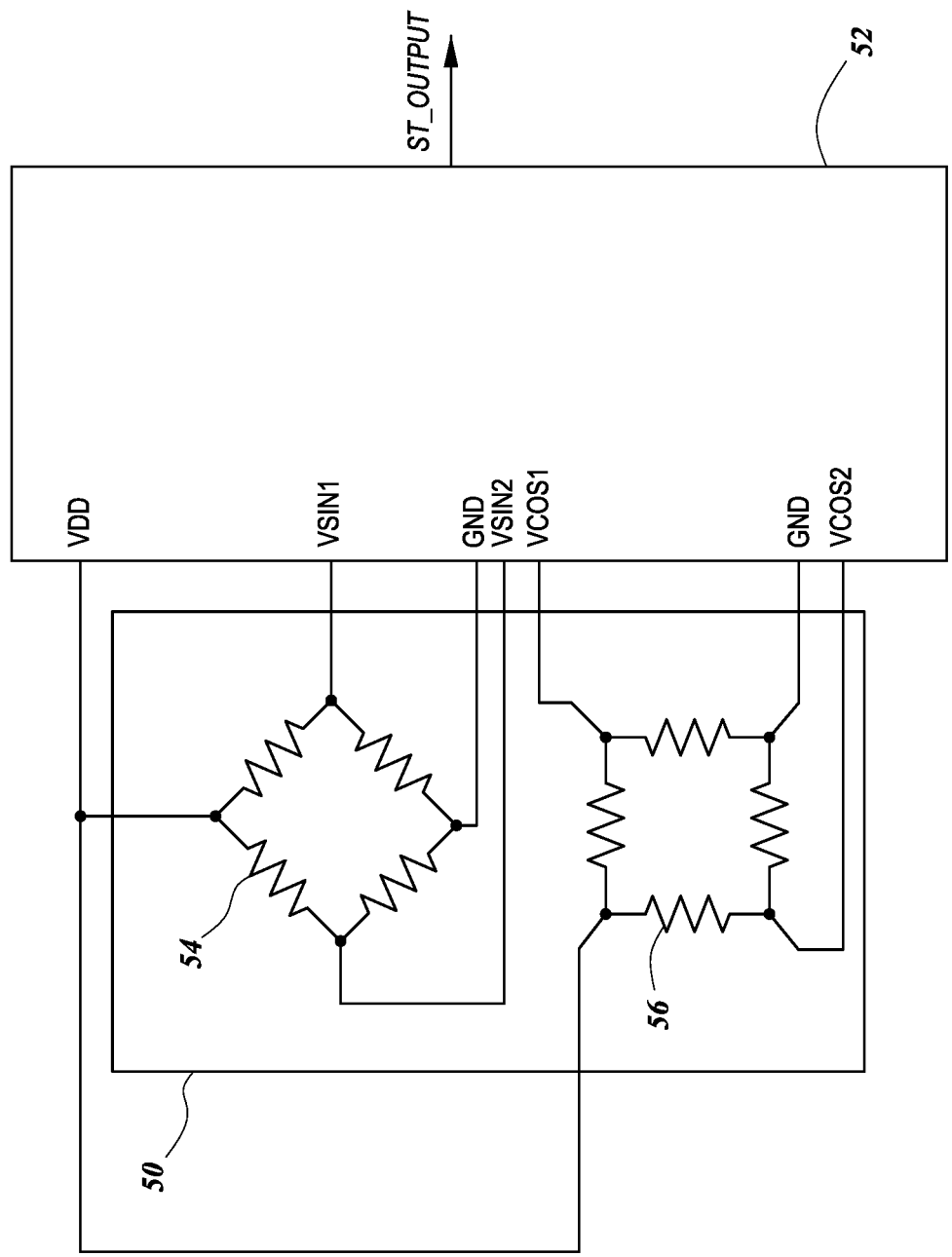
FIG. 3 is a schematic diagram showing a sensor portion with an interface circuit.

FIG. 3 is a schematic diagram showing a sensor portion 50 (e.g., a magnetic angle and/or torque sensor) with an interface circuit 52. The interface circuit 52 can be a part of the processing circuit 36 (see FIGS. 1 and 2). Alternatively, the interface circuit 52 can be a separate circuit between the processing circuit 36 and the output of the sensor portion 50. The sensor portion 50 can include a first Wheatstone bridge 54 and a second Wheatstone bridge 56.

The first and second Wheatstone bridges 54, 56 can include magnetoresistive elements, such as AMR elements, to sense a rotating magnetic field and to provide an absolute angle between 0 and 180 degrees. This, in turn, can provide rotational angle between 0 and 360 degrees, which also corresponds to an angle of between 0 and a radians. Additionally, each AMR element can be patterned onto an integrated circuit using an AMR process so that the first Wheatstone bridge 54 is rotated with respect to the second Wheatstone bridge 56. By having the first and second Wheatstone bridges 54, 56 rotated with respect to each other, the trigonometric sine and cosine of a rotational magnetic field can be determined over a range of 0 to 360 degrees.

As shown in FIG. 3, both the first and the second Wheatstone bridges 54, 56 are electrically connected to a supply voltage VDD and to ground GND. As illustrated, the interface circuit 52 receives voltages VSIN1 and VSIN2 from the sense nodes of the first Wheatstone bridge 54 and receives voltages VCOS1 and VCOS2 from the sense nodes of the second Wheatstone bridge 56. The interface circuit 52 can process the voltages VSIN1 and VSIN2 and the voltages VCOS1 and VCOS2 to determine sine and cosine signals, respectively, associated with a magnetic field. From the sine and cosine signals, the interface circuit 52 can determine an the angle of the magnetic field between 0 and 360 degrees. The interface circuit 52 can provide a single turn angle output data ST Output.

For example, the sensors 10, 12, 14 can comprise a structure similar to the sensor portion 50. Each of the sensors 10, 12, 14 can have a sine output (such as VSIN1 and/or VSIN2) and a cosine output (such as VCOS1 and/or VCOS2) which together may provide sufficient information on the direction of the magnetic field passing through that sensor to obtained the desired measurements.

Additional details of the components illustrated in FIGS. 1-3, variations of the system 1, and magnetic sensors may be found throughout U.S. Patent Application Publication No. 2019/0242764, the content of which is hereby incorporated by reference herein in its entirety and for all purposes.

Figure 4A:
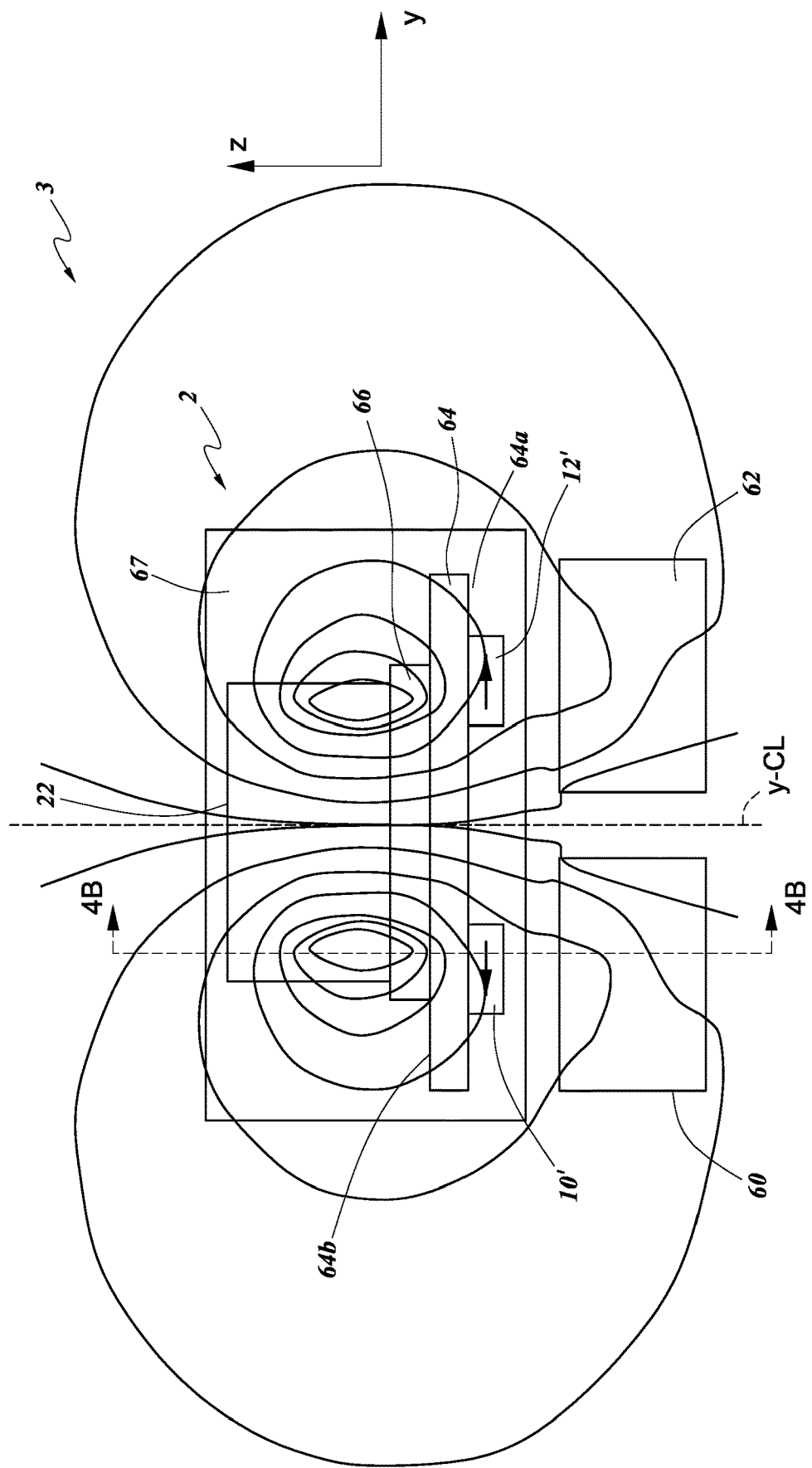
FIG. 4A is a schematic cross sectional side view of a sensor system taken along a yz-plane, according to an embodiment.

FIG. 4A is a schematic cross sectional side view showing a sensor system 3 taken along a yz-plane, according to an embodiment. The sensor system 3 can include a magnetic field sensor package 2 and target objects (a first target object 60 and a second target object 62). FIG. 4B is a schematic cross sectional side view of the sensor system 3 shown in FIG. 4A taken along an xz-plane in a first state in which the first target object 60 is positioned in a first orientation relative to the sensor package 2. FIGS. 4A and 4B also show magnetic flux lines around the magnetic field sensor package 2 and the target objects 60, 62.

The magnetic field sensor package 2 can include a substrate 64 having a front side 64a and a back side 64b opposite the front side, a first sensor die 10' and a second sensor die 12' mounted on the front side 64a of the substrate 64, a magnet 22 positioned on the back side 64b of the substrate 64, and a spacer 66 positioned between the substrate 64 and the magnet 22. The magnetic field sensor package 2 can also include a molding or encapsulating material 67 that can be disposed about the substrate 64, the first sensor die 10', the second sensor die 12', the magnet 22, and the spacer 66. In some embodiments, the spacer 66 can be omitted from the sensor package 2. In some embodiments, the package 2 may not include the molding material, and may alternatively be disposed in a cavity of a package housing. In some embodiments, the sensor package 2 can also include an application specific integrated circuit (ASIC) die as shown in FIGS. 6A-7B.

Figure 4C:
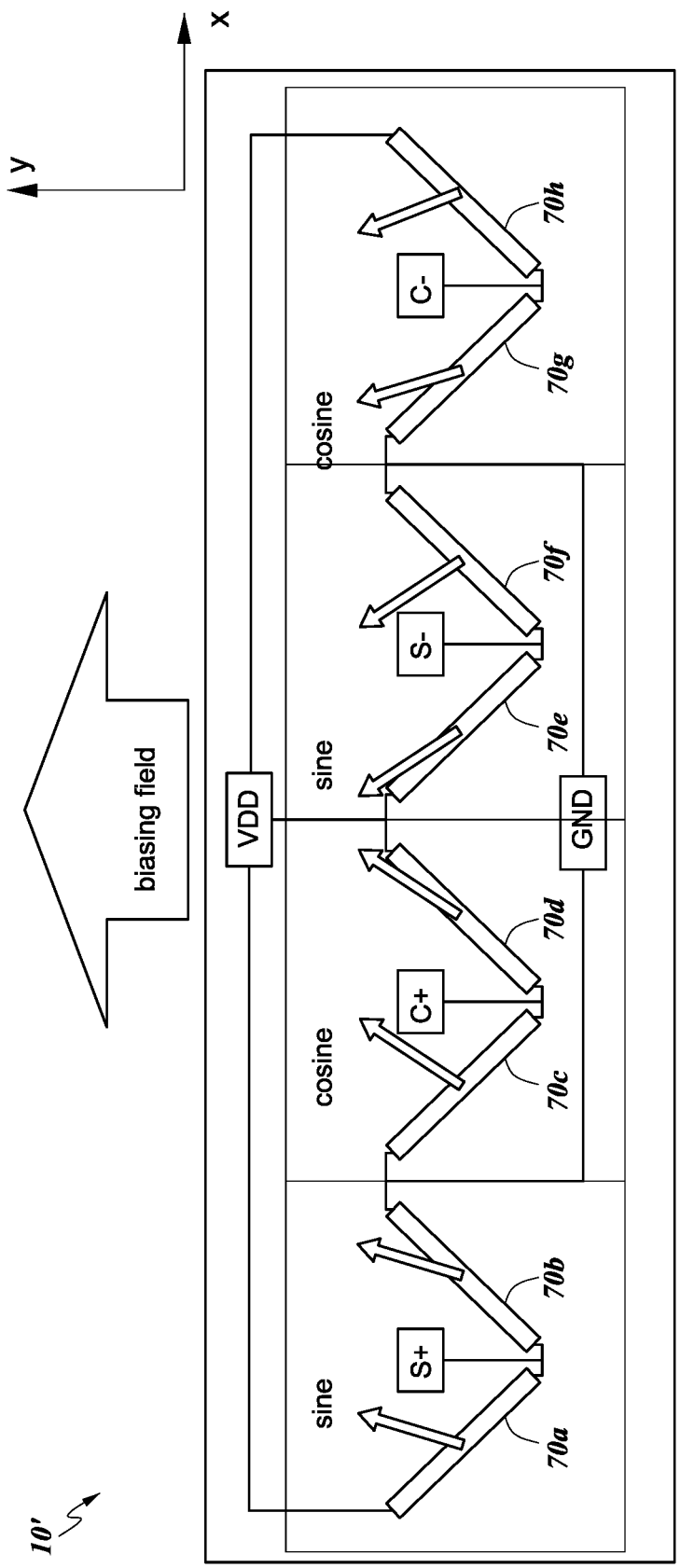
FIG. 4C is a schematic sensor architecture of a sensor having magnetoresistive elements arranged as a Wheatstone bridge in the first state.

FIG. 4C is a schematic sensor architecture of the first sensor die 10' having magnetoresistive elements 70a-70h arranged as a Wheatstone bridge. The magnetoresistive elements 70a-70h can be arranged so as to have the magnetization to be aligned in +45/−45 degrees directions relative to the resistor tracks of the magnetoresistive elements 70a-70h when a biasing field is applied. There are eight magnetoresistive elements illustrated in FIG. 4C. However, the first sensor die 10' or any of the sensors disclosed herein can comprise any suitable number of magnetoresistive elements. In some embodiments, the first sensor die 10' can comprise at least two half bridges.

As shown in FIG. 4A, the first sensor die 10' and the second sensor die 12' can be offset relative to a y-axis center line y-CL of the magnet 22. In some embodiments, at least a portion of the first sensor die 10' and/or at least a portion of the second sensor die 12' can be positioned within a footprint of the magnet 22. In some other embodiments, no portion of the first sensor die 10' and the second sensor die 12' is positioned within the footprint of the magnet 22. The first sensor die 10' can have a field component that points to the left on FIG. 4A, and the second sensor die 12' can have a field component that points to the right on FIG. 4A.

The magnet 22 can comprise a permanent magnet. The magnet 22 can be configured to provide a bias field for the first sensor die 10' and the second sensor die 12'. The magnet 22 can also be configured to provide an excitation field for the first target object 60 and the second target object 62. The magnet 22 can be oriented so as to vertically align the north pole N and the south pole S of the magnet 22 along the z-axis.

In some embodiments, the substrate 64 can comprise a molded lead frame substrate, which includes a conductive lead frame embedded in a molding material or molding compound. In other embodiments, the substrate 64 can comprise a laminate substrate (e.g., a printed circuit board or PCB), a ceramic substrate, a semiconductor substrate, or any other suitable carrier.

The spacer 66 can comprise any suitable material. In some embodiments, the spacer 66 can comprise a non-ferromagnetic material. The spacer 66 can provide a sufficient spacing between the magnet 22 and the sensors (the first sensor die 10' and the second sensor die 12') for the magnet to provide a desirable biasing field for the sensors. A thickness of the spacer 66 can be adjusted to add or reduce the distance between the magnet 22 and the sensors for an optimal field distribution. The spacer 66 can be particularly beneficial when the substrate 64 comprises a relatively thin substrate, such as a molded lead frame substrate.

The molding material 67 can comprise any suitable non-conductive and/or non-ferromagnetic material. For example, the molding material 67 can comprise plastic or polymer (e.g., liquid crystal polymer (LCP) or acrylonitrile butadiene styrene (ABS)).

In some embodiments, the first target object 60 and the second target object 62 can comprise any shape. For example, the first target object 60 and the second target object 62 can comprise a sheet or disc with holes or gear/tooth structures 68. The first target object 60 and the second target object 62 can rotate about an axis and cause distortion to the magnetic field near the first sensor die 10' and the second sensor die 12', respectively. The first target object 60 and/or the second target object 62 can have the same or generally similar structure and/or functionality as any of the magnetic targets 16, 18, 20 described above with respect to FIGS. 1 and 2.

FIG. 4B also shows a graph indicating the magnetic field (Hx) or magnetic flux density (Bx) component along the first sensor die 10' in the first state. FIG. 4C also shows arrows indicating magnetization directions at each of the magnetoresistive elements 70a-70h for the arrangement shown in FIG. 4B. As seen from the graph in FIG. 4B and the arrows in FIG. 4C, the first sensor die 10' can detect distortions in the magnetic field caused by the first target object 60.

Figure 5A:
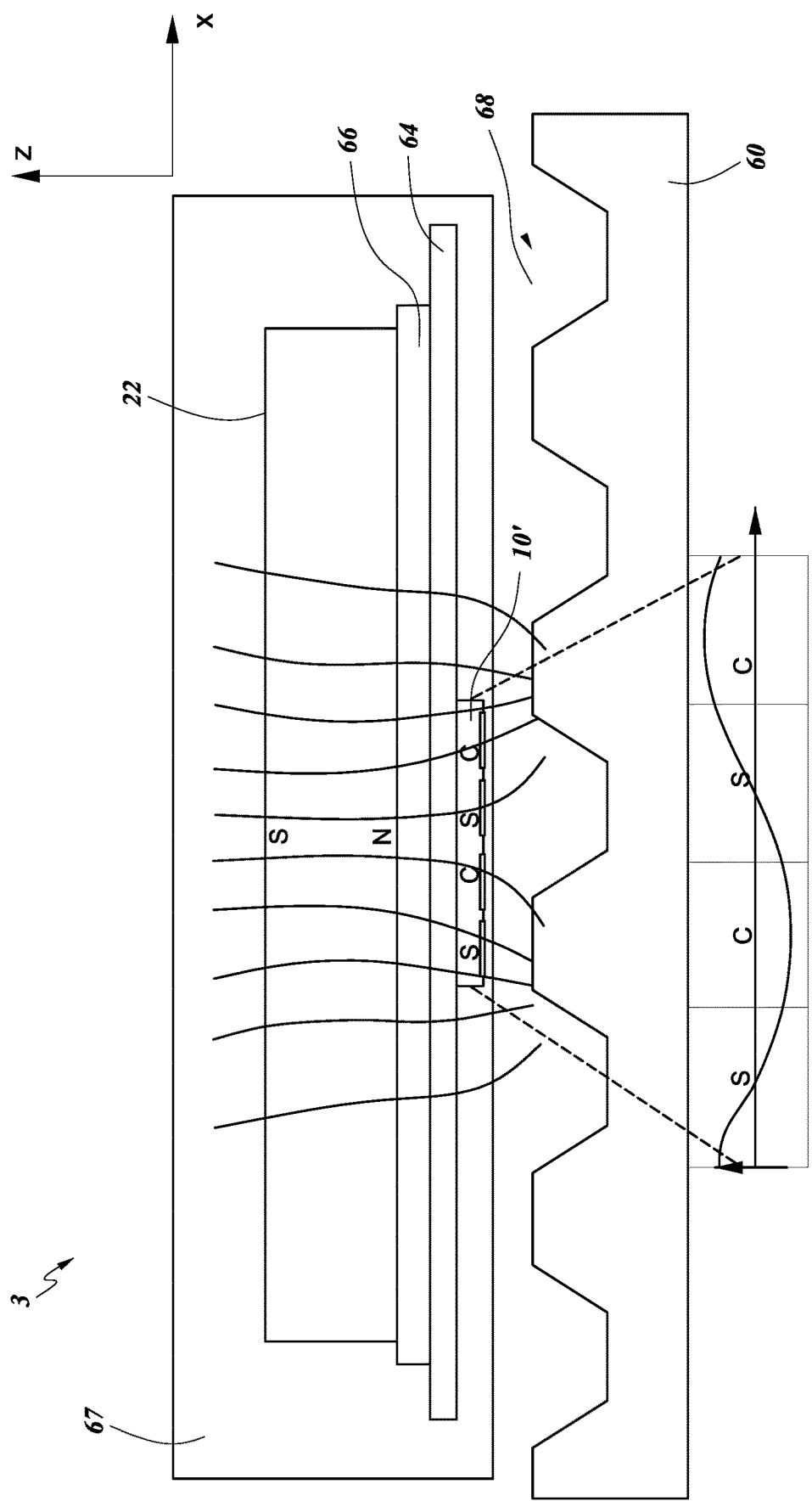
FIG. 5A is a schematic cross sectional side view of the sensor system of FIGS. 4A and 4B taken along the xz-plane in a second state.
Figure 5B:
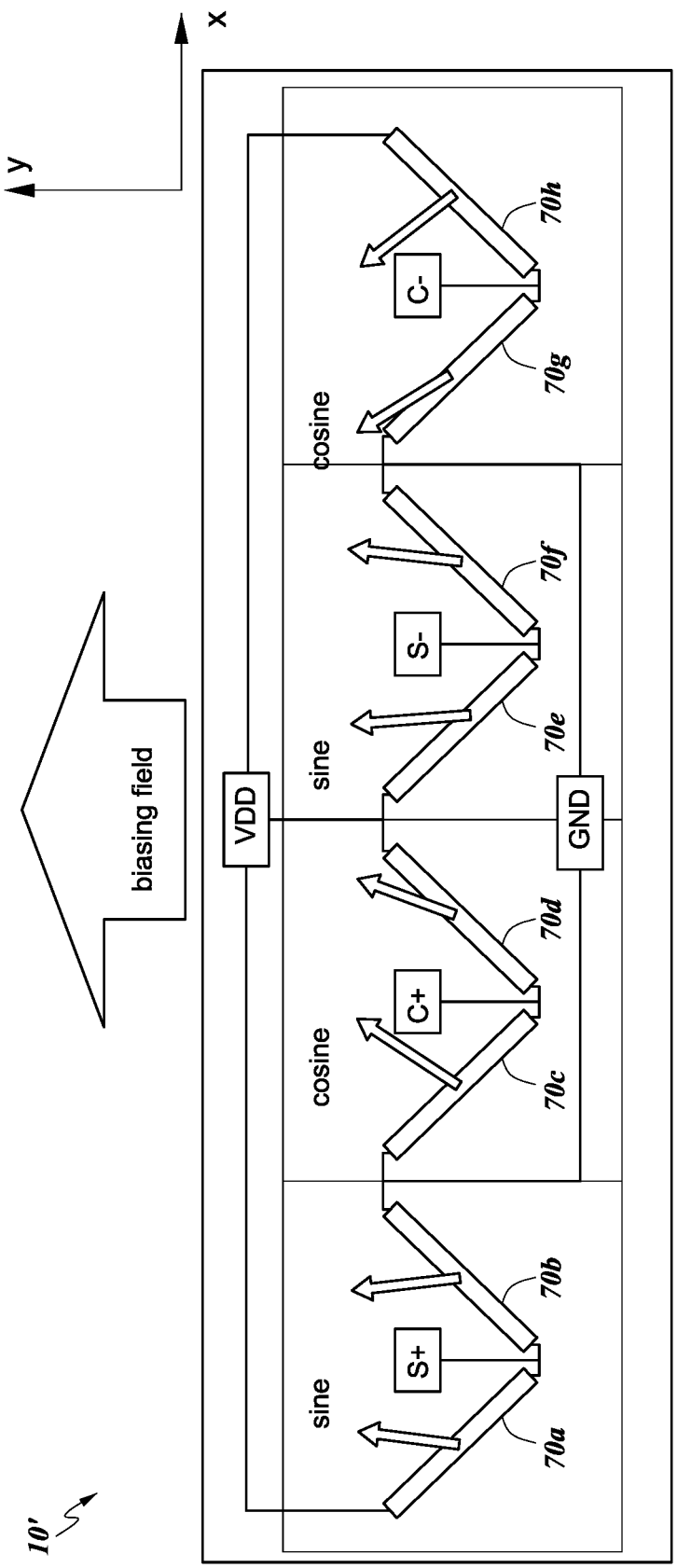
FIG. 5B is a schematic sensor architecture of a sensor in the second state.

FIG. 5A is a schematic cross sectional side view of the sensor system 3 shown in FIG. 4B in a second state in which the first target object 60 is positioned in a second orientation relative to the sensor package 2. FIG. 5A also shows magnetic flux lines around the magnetic field sensor package 2 and the first target object 60, and a graph indicating inductance of the magnetic field along the first sensor die 10' in the second state. FIG. 5B is a schematic sensor architecture of the first sensor die 10' having the magnetoresistive elements 70a-70h arranged as a Wheatstone bridge. FIG. 5B also shows arrows indicating magnetization directions at each of the magnetoresistive elements 70a-70h for the arrangement shown in FIG. 5A. FIGS. 5A and 5B are generally similar to FIGS. 4B and 4C, respectively. However, in FIG. 5A, the first target object 60 in the second state is shifted relative to the first target object 60 in the first state as shown in FIG. 4B. Therefore, the arrows indicating magnetization directions at each of the magnetoresistive elements 70a-70h in FIG. 5B point in different directions than the arrows in FIG. 4C.

In some embodiments, during operation of the sensor system 3, the tooth structure 68 of the first target object 60 may induce, as a function of the rotational position of the first target object 60 relative to the first sensor die 10', changes in the magnetic field passing through first sensor die 10'. The first sensor die 10' can detect these changes in the magnetic field as shown in FIGS. 4A-5B, and determine a rotation angle of the first target object 60. The sensor system 3 can comprise processing electronics that is configured to determine an absolute position of the first target object and the second target object using a Nonius or Vernier algorithm.

When a magnet and a sensor are integrated as a sensor package, such as the sensor package 2, the package can be utilized in a sensor system more easily than a sensor module that does not integrate the magnet and the sensor in a package. The sensor package can enable for relatively easy calibration. For example, when a calibration is provided due to a tolerance between positions of the magnet and the sensor that causes sensor offset voltage, amplitude difference between sine and cosine output, etc., the calibration can be conducted for the sensor package and no further calibration may not be needed. In some embodiments, the sensor package, such as when an embedded lead frame is used, can be smaller than a sensor module that does not integrate the magnet and the sensor in a package. Also, when the magnet and the sensor are packaged together, the sensor package can enable relatively easy handling. Further, the sensor package can ensure that the magnet properly provides a biasing field for the sensor and an excitation field for the target object.

Figure 6A:
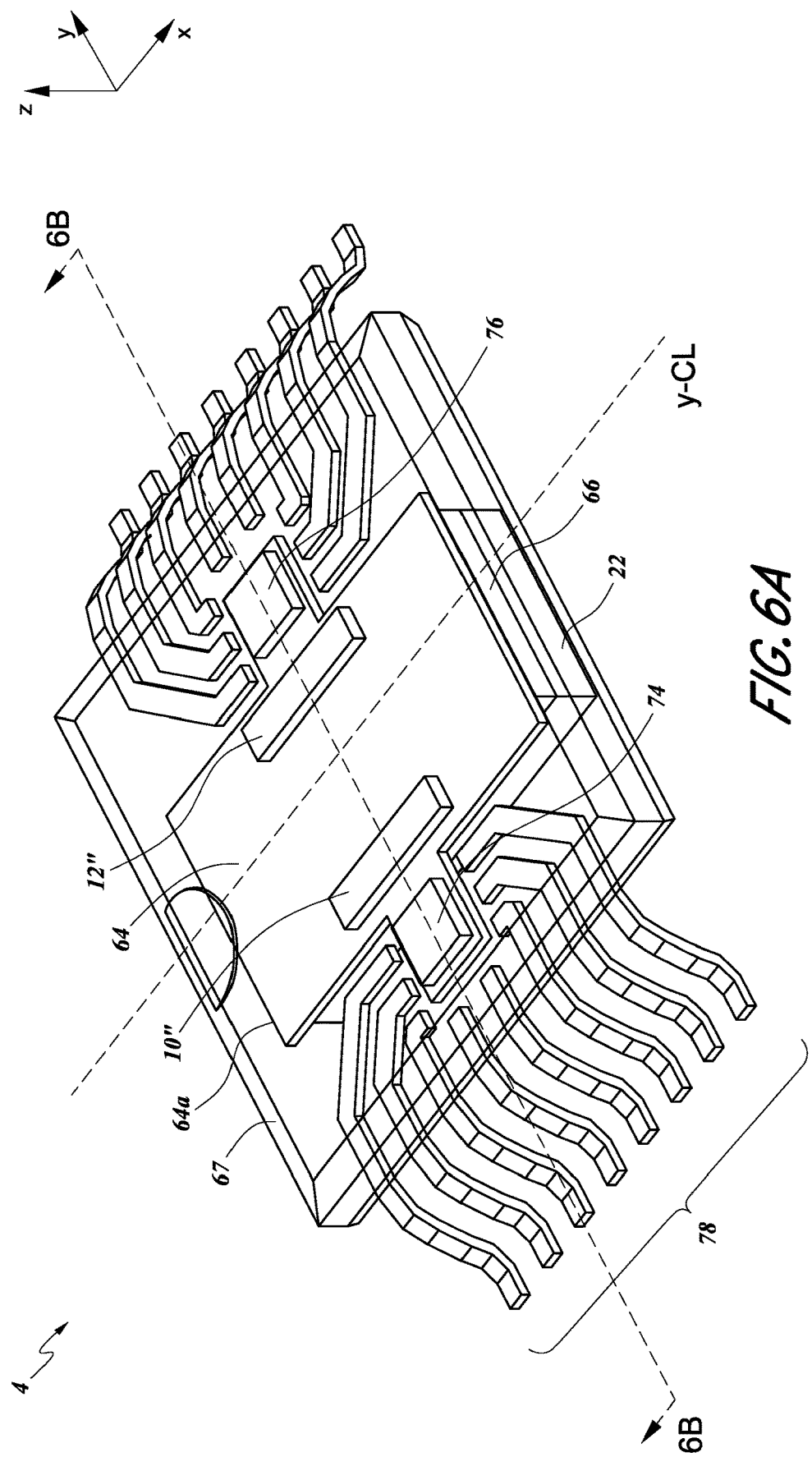
FIG. 6A is a schematic perspective view of a sensor package according to another embodiment.
Figure 6B:
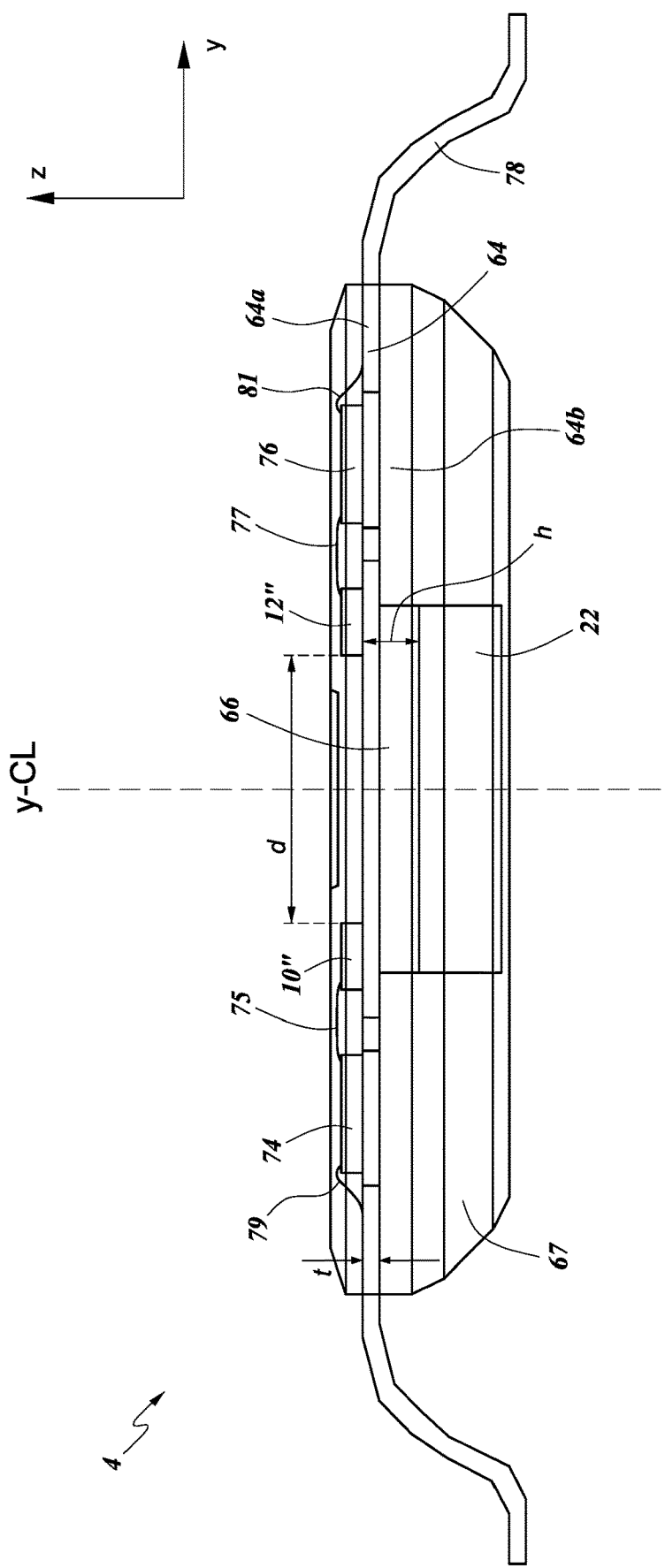
FIG. 6B is a schematic cross sectional side view of the sensor package of FIG. 6A.

FIG. 6A is a schematic perspective view of a sensor package 4 according to another embodiment. FIG. 6B is a schematic cross sectional side view of the sensor package 4 of FIG. 6A. Unless otherwise noted, components of FIGS. 6A and 6B may be the same as or similar to like components of FIGS. 1A-5B. The sensor package 4 can include a substrate 64 that has a front side 64a and a back side 64b, a first sensor die 10" and a second sensor die 12" mounted on the front side 64a of the substrate 64, a first electronic component 74 and a second electrical component 76 mounted on the front side 64a of the substrate 64, and a magnet 22 that is disposed on the back side 64b of the substrate 64. The sensor package 4 can also include a spacer 66 between the substrate 64 and the magnet 22. The sensor package 4 can also include a molding material 67 that is disposed about the substrate 64, the first sensor die 10", the second sensor die 12", the magnet 22, and the spacer 66. In some embodiments, the first sensor die 10", the second sensor die 12", the magnet 22, and the spacer 66 can be completely embedded in the molding material 67.

In some embodiment, the first sensor die 10" can be electrically coupled with the first electronic component 74 by way of a bonding wire 75. Likewise, the second sensor die 12" can be electrically coupled with the second electronic component 76 by way of a bonding wire 77. In some other embodiments, the first sensor die 10" and the second sensor die 12" can be flipchip mounted on the substrate 64 by way of solder balls. In such embodiments, the first sensor die 10" and the second sensor die 12" can be coupled with the first electronic component 74 and the second electronic component 76, respectively, through an interconnect formed in or with the substrate 64. In some embodiments, the first electronic component 74 can be electrically coupled with the substrate 64 by way of bonding wire 79, and the second electronic component 76 can be electrically coupled with the substrate 64 by way of bonding wire 81. In some other embodiments, the first electronic component 74 and the second electronic component 76 can be flipchip mounted to the substrate 64.

The first sensor die 10" and the second sensor die 12" can comprise Anisotropic Magneto Resistive (AMR) sensor elements, Giant Magneto Resistive (GMR) sensor elements, any magnetoresistive sensing elements (xMR), Tunnel Magneto Resistive sensor elements, or other suitable technologies. The first sensor die 10" and the second sensor die 12" can provide Sine and Cosine outputs.

In some embodiments, the first sensor die 10" and the second sensor die 12" can each comprise magnetoresistive elements (see FIGS. 3, 4C, 5B, and 7) arranged as a Wheatstone bridge, or a half bridge. In some embodiments, the first sensor die 10" and the second sensor die 12" can each comprise at least two half bridges. The first sensor die 10" and the second sensor die 12" can comprise any one or more structures and/or functionalities of a magnetic sensor described herein.

The first sensor die 10" and the second sensor die 12" can be offset along a y-axis relative to a y-axis center line y-CL of the magnet 22. In some embodiments, at least a portion of the first sensor die 10" and/or at least a portion of the second sensor die 12" can be positioned within a footprint of the magnet 22. The first sensor die 10" and the second sensor die 12" can configure to detect distortions in magnetic field caused by magnetic objects (not illustrated), as disclosed herein. In some embodiments, the first sensor die 10" and the second sensor die 12" can configure to detect distortions in magnetic field caused by two different magnetic objects. For example, the sensor package 4 can be positioned near two gears that can rotate about a shaft such that the first sensor die 10" and the second sensor die 12" are vertically between the magnet 22 and the two gears along a z-axis.

The first sensor die 10" and the second sensor die 12" are spaced apart by a distance d along the y-axis. The distance d between the first sensor die 10" and the second sensor die 12" can be in a range from 3 mm to 6 mm, 4 mm to 6 mm, or 3 mm to 5 mm. In some embodiments, the first die 10" and/or the second sensor die 12" can be spaced apart from the magnet 22 by a height h along the z-axis. The height h can be in a range from 0.24 mm to 0.4 mm, from 0.3 mm to 0.4 mm, or from 0.24 mm to 0.3 mm.

In some embodiments, the substrate 64 can comprise a lead frame, such as a molded lead frame substrate, which includes a conductive lead frame embedded in the molding material 67 or molding compound. In other embodiments, the substrate 64 can comprise a laminate substrate (e.g., a printed circuit board or PCB), a ceramic substrate, or a semiconductor substrate. In some embodiments, the substrate 64 can comprise legs 78 (e.g., terminals) that extends out from the molding material 67. The legs 78 can configure to electrically connect to an external device or substrate, such as a system board or a printed circuit board (PCB), thereby providing at least a portion of an electrical pathway between the first sensor die 10", the second sensor die 12", the first electronic component 74, and/or the second electronic component 76, and the external device or substrate. The substrate 64 has thickness t between the front side 64a and the back side 64b. In some embodiments, the thickness t of the substrate 64 can be in a range from 0.1 mm to 0.5 mm, 0.2 mm to 0.5 mm, or 0.1 mm to 0.3 mm In some embodiments, the first electronic component 74 and the second electronic component 76 can be in electrical communication with the first sensor die 10" and the second sensor die 12", respectively, through the substrate 64 or bonding wires (not illustrated). In some embodiments, the first electronic component 74 and the second electronic component 76 can comprise an integrated device die such as an ASIC or other type of processor. In some embodiment, the ASIC die can receive signals transduced by the first sensor die 10" and the second sensor die 12", and can pre-process those signals before transmission to the external device or substrate. For example, the ASIC die can comprise active circuitry which converts the analog signals transduced by the first sensor die 10" and the second sensor die 12" into digital signals, provides signal conditioning functions, and/or performs various other processes received from (and/or transmitted to) the first sensor die 10" and the second sensor die 12".

The spacer 66 can comprise any suitable material. In some embodiments, the spacer 66 can comprise a non-ferromagnetic material. The spacer 66 can provide a sufficient spacing between the magnet 22 and the sensors (the first sensor die 10" and the second sensor die 12") for the magnet to provide a desirable biasing field for the sensors.

Figure 7:
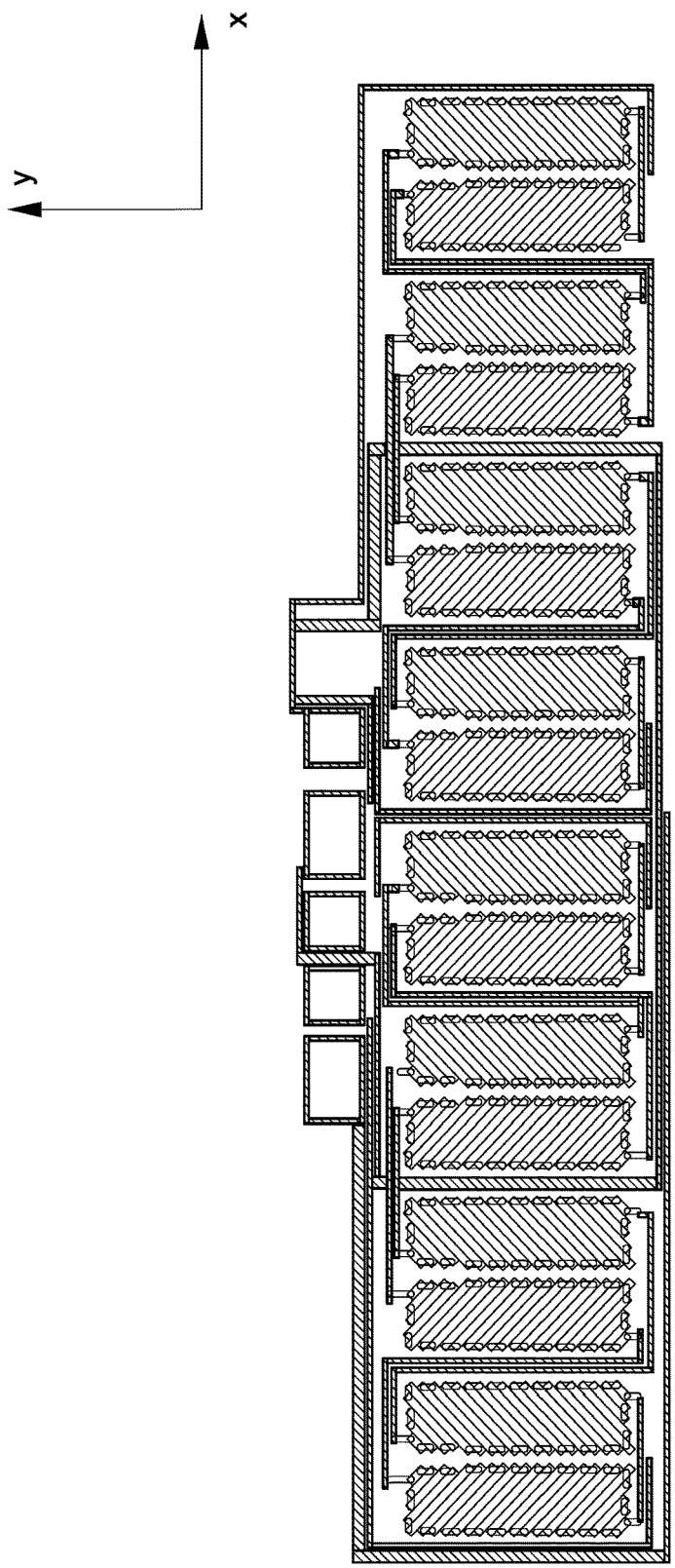
FIG. 7 is a schematic diagram showing an architecture of a sensor die.

FIG. 7 is a schematic diagram showing an architecture of a sensor die. Any sensor disclosed herein can comprise the same or generally similar circuit topology as the circuit topology shown in FIG. 7. The sensor chip can comprise magnetoresistive elements 82 that are arranged as Wheatstone bridges. As illustrated in FIG. 7, the magnetoresistive elements 82 can be arranged in +45/−45 degree directions relative to the x-axis.

Figure 8:
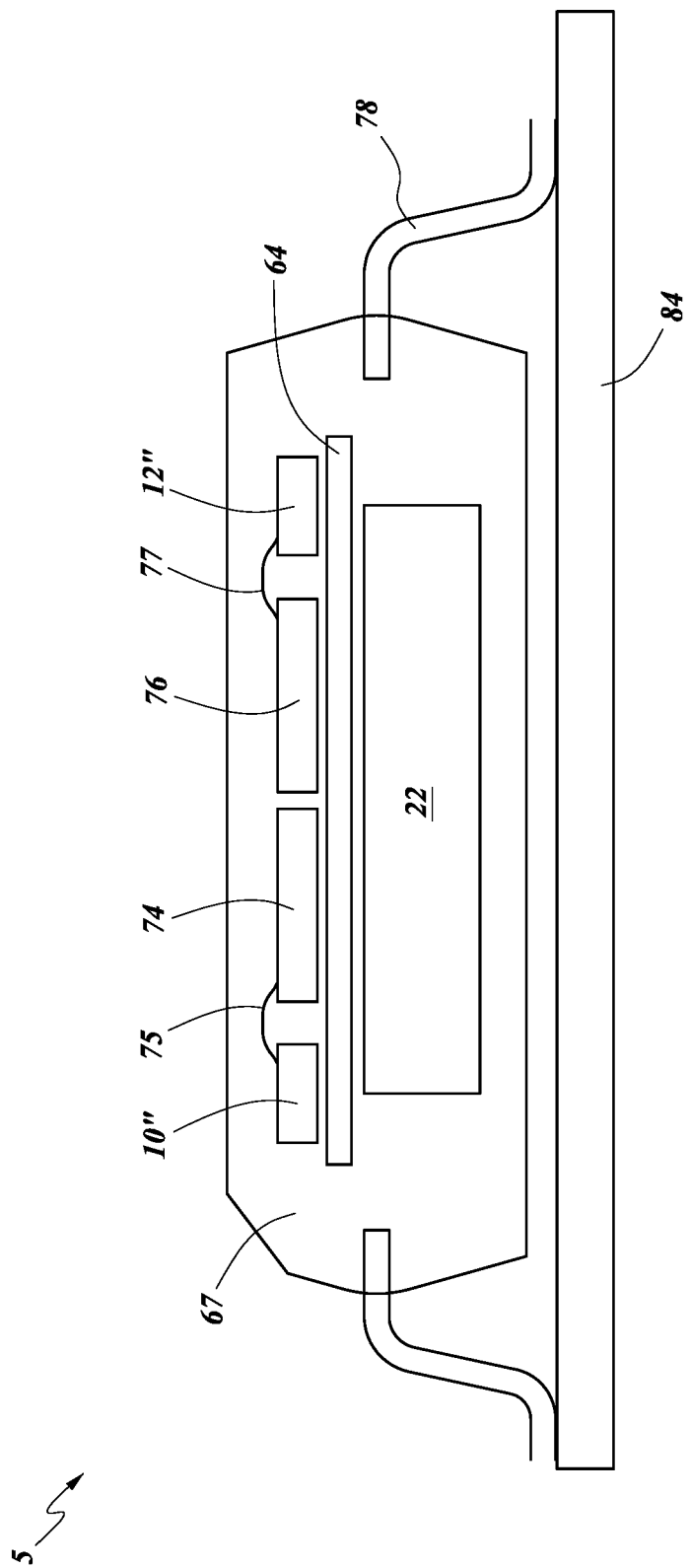
FIG. 8 is a schematic cross sectional side view of a sensor package according to another embodiment.

FIG. 8 is a schematic cross sectional side view of a sensor package 5 according to another embodiment. Unless otherwise noted, components of FIG. 8 may be the same as or similar to like components of FIGS. 1A-6B. The sensor package 5 can include a substrate 64 that has a front side 64a and a back side 64b, a first sensor die 10" and a second sensor die 12" mounted on the front side 64a of the substrate 64, a first electronic component 74 and a second electrical component 76 mounted on the front side 64a of the substrate 64, and a magnet 22 that is disposed on the back side 64b of the substrate 64. The sensor package 5 can also include a molding material 67 that is disposed about the substrate 64, the first sensor die 10", the second sensor die 12", and the magnet 22. In some embodiments, the first sensor die 10", the second sensor die 12", and the magnet 22 can be completely embedded in the molding material 67.

In some embodiment, the first sensor die 10" can be electrically coupled with the first electronic component 74 by way of a bonding wire 75. Likewise, the second sensor die 12" can be electrically coupled with the second electronic component 76 by way of a bonding wire 77. In some other embodiments, the first sensor die 10" and the second sensor die 12" can be flipchip mounted on the substrate 64 by way of solder balls. In such embodiments, the first sensor die 10" and the second sensor die 12" can be coupled with the first electronic component 74 and the second electronic component 76, respectively, through an interconnect formed in or with the substrate 64.

The substrate 64 can comprise legs 78 (e.g., terminals) that extends out from the molding material 67. The legs 78 can configure to electrically connect the package 5 to an external device or substrate, such as a system board or a printed circuit board (PCB) 84. The legs 78 can be connected to the PCB 84 thereby providing at least a portion of an electrical pathway between the first sensor die 10", the second sensor die 12", the first electronic component 74, and/or the second electronic component 76, and the PCB 84.

Figure 9:
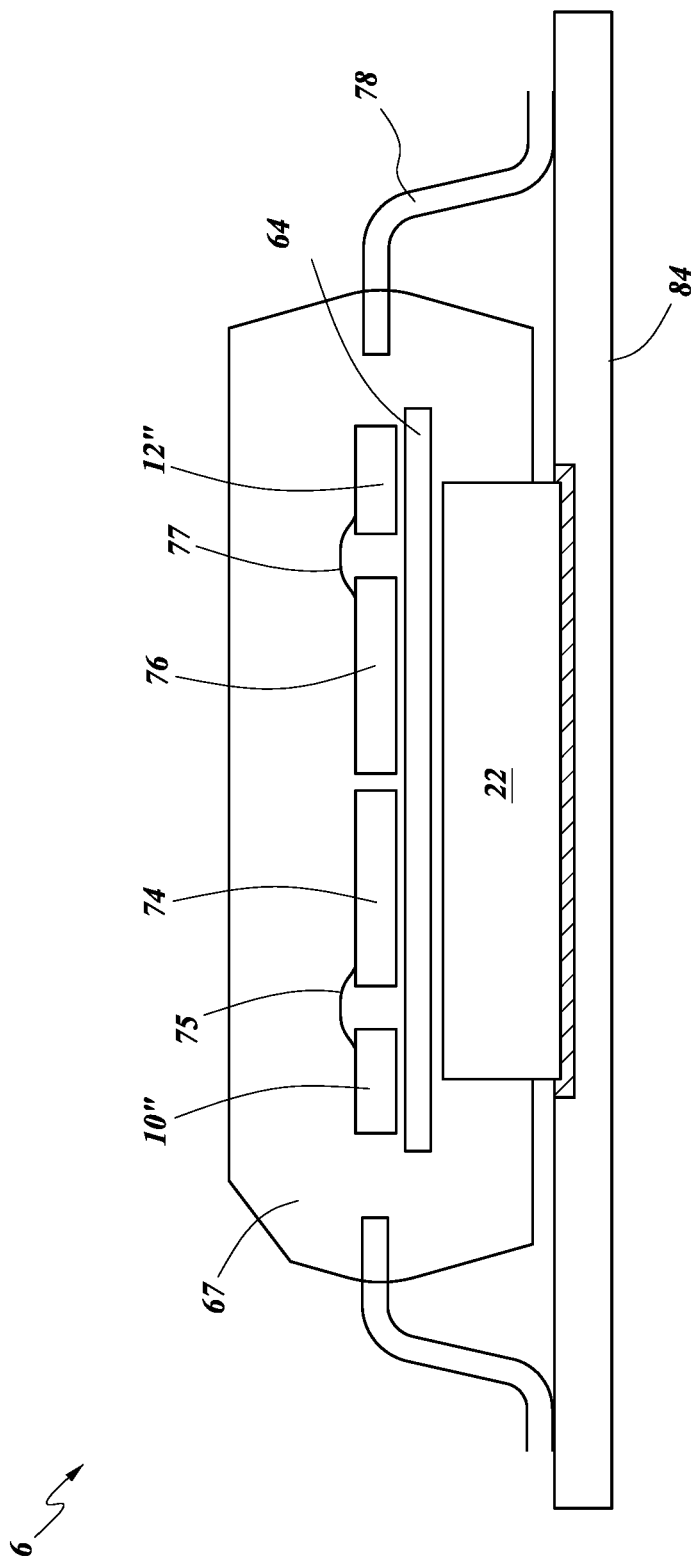
FIG. 9 is a schematic cross sectional side view of a sensor package according to another embodiment.

FIG. 9 is a schematic cross sectional side view of a sensor package 6 according to another embodiment. Unless otherwise noted, components of FIG. 9 may be the same as or similar to like components of FIGS. 1A-6B, and 8. The sensor package 6 can include a substrate 64 that has a front side 64a and a back side 64b, a first sensor die 10" and a second sensor die 12" mounted on the front side 64a of the substrate 64, a first electronic component 74 and a second electrical component 76 mounted on the front side 64a of the substrate 64, and a magnet 22 that is disposed on the back side 64b of the substrate 64. The sensor package 6 can also include a molding material 67 that is disposed about the substrate 64, the first sensor die 10", the second sensor die 12", and a portion of the magnet 22. At least a portion of the magnet 22 can be free from the molding material 67.

In some embodiment, the first sensor die 10" can be electrically coupled with the first electronic component 74 by way of a bonding wire 75. Likewise, the second sensor die 12" can be electrically coupled with the second electronic component 76 by way of a bonding wire 77. In some other embodiments, the first sensor die 10" and the second sensor die 12" can be flipchip mounted on the substrate 64 by way of solder balls. In such embodiments, the first sensor die 10" and the second sensor die 12" can be coupled with the first electronic component 74 and the second electronic component 76, respectively, through an interconnect formed in or with the substrate 64.

The substrate 64 can comprise legs 78 (e.g., terminals) that extends out from the molding material 67. The legs 78 can configure to electrically connect the package 6 to an external device or substrate, such as a system board or a printed circuit board (PCB) 84. The legs 78 can be connected to the PCB 84 thereby providing at least a portion of an electrical pathway between the first sensor die 10", the second sensor die 12", the first electronic component 74, and/or the second electronic component 76, and the PCB 84. The PCB 84 can comprise a cavity 88. A portion of the magnet 22 that is not embedded in the molding material 67 can be disposed in the cavity 88.

Figure 10A:
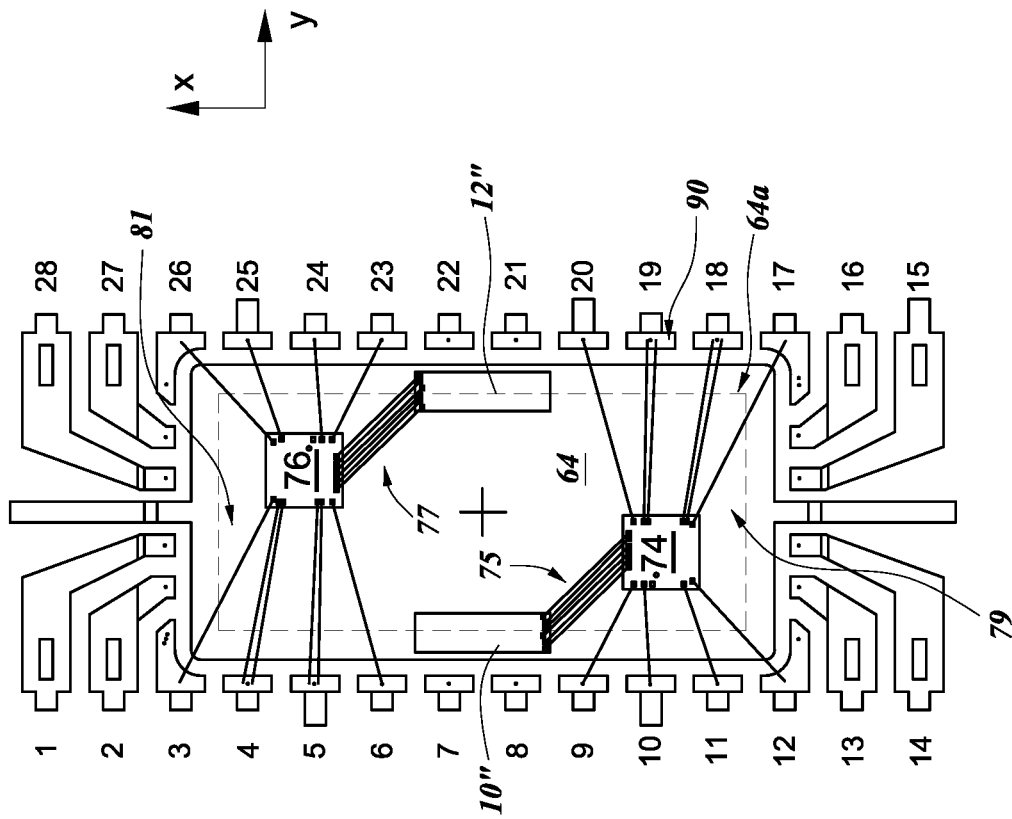
FIG. 10A is a schematic top plan view of a sensor package according to an embodiment.

FIG. 10A is a schematic top plan view of a sensor package according to an embodiment. In some embodiments, the sensor package illustrated in FIG. 10A can comprise the sensor package 5 of FIG. 8 or the sensor package 6 of FIG. 9. In FIG. 10A, a first sensor die 10", a second sensor die 12", a first electronic component 74, and a second electronic component 76 are mounted on a top side 64a of a substrate 64.

In some embodiment, the first sensor die 10" can be electrically coupled with the first electronic component 74 by way of a bonding wires 75. Likewise, the second sensor die 12" can be electrically coupled with the second electronic component 76 by way of a bonding wires 77. In some other embodiments, the first sensor die 10" and the second sensor die 12" can be flipchip mounted on the substrate 64 by way of solder balls. In such embodiments, the first sensor die 10" and the second sensor die 12" can be coupled with the first electronic component 74 and the second electronic component 76, respectively, through an interconnect formed in or with the substrate 64. In some embodiments, the first electronic component 74 can be electrically coupled with contacts 90 by way of bonding wires 79, and the second electronic component 76 can be electrically coupled with the contacts 90 by way of bonding wires 81. In some other embodiments, the first electronic component 74 and the second electronic component 76 can be flipchip mounted to the substrate 64.

Figure 10B:
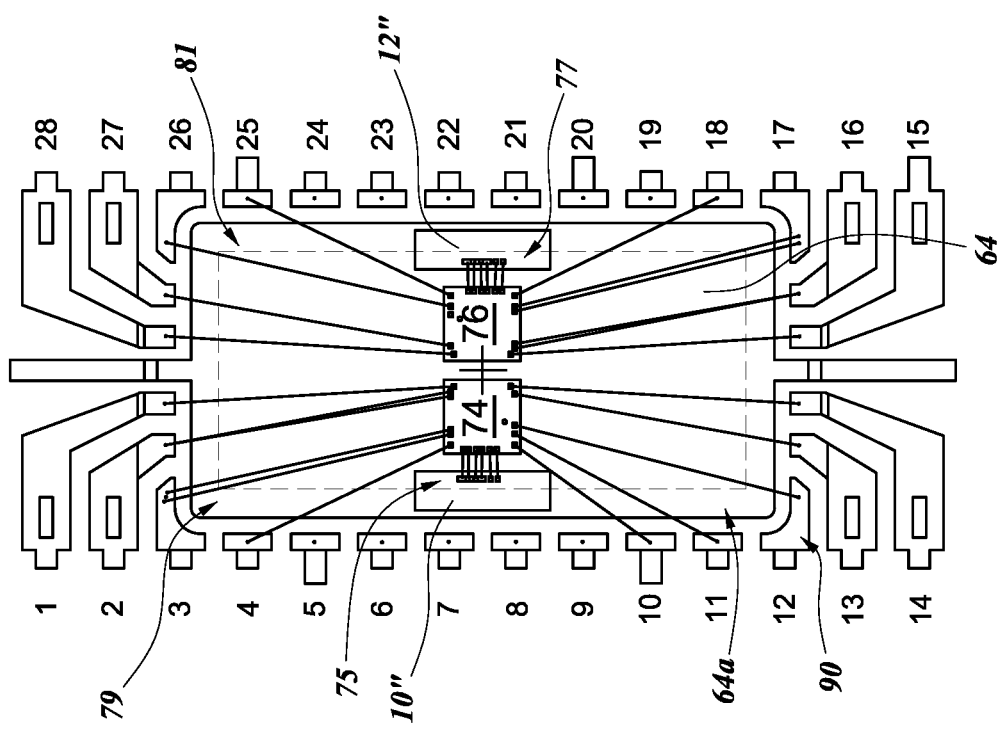
FIG. 10B is a schematic top plan view of a sensor package according to another embodiment.

FIG. 10B is a schematic top plan view of a sensor package according to an embodiment. In some embodiments, the sensor package illustrated in FIG. 10B can comprise the sensor package 5 of FIG. 8 or the sensor package 6 of FIG. 9. The sensor package of FIG. 10B can be generally similar with the sensor package of FIG. 10A except that the first electronic component 74 and the second electronic component 76 are mounted on different locations on the top side 64a of the substrate 64.

In FIG. 10A, at least some of the bonding wires 79, 91 are much longer than the bonding wires 75, 77. In some applications, a relatively long bonding wire, such as a bonding wire that is longer than 5 mm can introduce undesirable parasitics. Therefore, in some embodiments, the locations of the first electronic component 74 and the second electronic component 76 illustrated in FIG. 10B can be more desirable than those illustrated in FIG. 10A. In some embodiments, the locations of the first electronic component 74 and the second electronic component 76 illustrated in FIG. 10B can enable a length of each wire of the bonding wires 75, 77, 79, 81 to be less than 5 mm.

The technology disclosed herein can be implemented in a variety of electronic systems. Aspects of the disclosure are applicable to any systems and/or devices that could benefit from the magnetic sensing technology disclosed herein.

Aspects of this disclosure can be implemented in various electronic devices. For instance, aspects of this disclosure can be implemented in any electronic device or electronic component that could benefit from the technology disclosed herein. Examples of the electronic devices can include, but are not limited to, consumer electronic products, parts of the consumer electronic products, electronic test equipment, vehicular electronics systems, etc. Examples of the electronic devices can include, but are not limited to, computing devices, communications devices, electronic household appliances, automotive electronics systems, other vehicular electronics systems, industrial control electronics systems, etc. Further, the electronic devices can include unfinished products.

Throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural may also include the plural or singular, respectively. The word "or" in reference to a list of two or more items, is generally intended to encompass all of the following interpretations of the word: any of the items in the list, all of the items in the list, and any combination of the items in the list. The x-axis, y-axis, and z-axis used herein may be defined in local coordinates in each element or figure, and may not necessarily correspond to fixed Cartesian coordinates.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

What is claimed is:

1. A magnetic field sensor package comprising:
   a lead frame having a front side and a back side opposite the front side;
   a first magnetic field sensor die mounted on the front side of the lead frame, the first magnetic field sensor die having a first half bridge and a second half bridge, the first half bridge configured to provide a first output signal and the second half bridge configured to provide a second output signal;
   a second magnetic field sensor die mounted on the front side of the lead frame and spaced apart from the first magnetic field sensor along the front side of the lead frame, the second magnetic field sensor die having a third half bridge and a fourth half bridge, the third half bridge configured to provide a third output signal and the fourth half bridge configured to provide a fourth output signal; and
   a magnet disposed on the back side of the lead frame, the magnet providing a bias field for the first magnetic field sensor die and the second magnetic field sensor die.

2. The magnetic field sensor package of claim 1, wherein the first half bridge comprises a first magnetoresistive element and a second magnetoresistive element, the second half bridge comprises a third magnetoresistive element and a fourth magnetoresistive element, the third half bridge comprises a fifth magnetoresistive element and a sixth magnetoresistive element, and the fourth half bridge comprises a seventh magnetoresistive element and an eighth magnetoresistive element arranged.

3. The magnetic field sensor package of claim 1, wherein the first magnetic field sensor die is configured to be positioned between the magnet and a first target object, and the first magnetic field sensor die is configured to measure a magnetic field disturbance caused by the first target object, and wherein the second magnetic field sensor die is configured to be positioned between the magnet and a second target object, and the second magnetic field sensor die is configured to measure a magnetic field disturbance caused by the second target object.

4. The magnetic field sensor package of claim 1, further comprising a molding material disposed about the lead frame, the first magnetic field sensor die, the second magnetic field sensor die, and the magnet.

5. The magnetic field sensor package of claim 1, further comprising an application specific integrated circuit (ASIC) die mounted on the front side of the lead frame and in electrical communication with the first magnetic field sensor die.

6. The magnetic field sensor package of claim 1, further comprising a spacer disposed between the magnet and the back side of the lead frame.

7. The magnetic field sensor package of claim 1, wherein at least a portion of the first magnetic field sensor die and at least a portion of the second magnetic field sensor die are positioned within a footprint of the magnet.

8. The magnetic field sensor package of claim 1, wherein the first magnetic field sensor die comprises a giant magnetoresistance (GMR) sensor, a tunnel magnetoresistance (TMR) sensor, or an anisotropic magnetoresistance (AMR) sensor.

9. The magnetic field sensor package of claim 1, wherein the first magnetic field sensor die and the magnet are vertically separated at least in part by the lead frame, the first magnetic field sensor die is horizontally offset relative to a center of the magnet.

10. The magnetic field sensor package of claim 9, wherein the magnet is arranged such that a north pole and a south pole of the magnet are vertically aligned.

11. A magnetic field sensor package comprising:
    a substrate having a front side and a back side opposite the front side;
    a first magnetic field sensor die mounted on the front side of the substrate and electrically connected to the substrate, the first magnetic field sensor die having a first magnetoresistive element and a second magnetoresistive element arranged as a first half bridge, the first magnetic field sensor configured to sense a first magnetic field disrupted at least in part by a first target object;
    a second magnetic field sensor die mounted on the front side of the substrate and electrically connected to the substrate, the second magnetic field sensor die having a third magnetoresistive element and a fourth magnetoresistive element arranged as a second half bridge, the second magnetic field sensor configured to sense a second magnetic field disrupted at least in part by a second target object;
    a magnet disposed on the back side of the substrate, the magnet providing a bias field for the first magnetic field sensor die and the second magnetic field sensor die, and an excitation field for the first and second target objects; and
    a molding material disposed about at least portions of the substrate, the first magnetic field sensor die, the second magnetic field sensor die, and the magnet.

12. The magnetic field sensor package of claim 11, wherein the substrate comprises a lead frame.

13. The magnetic field sensor package of claim 11, further comprising an application specific integrated circuit (ASIC) die mounted on the front side of the substrate and in electrical communication with the first magnetic field sensor die.

14. The magnetic field sensor package of claim 11, wherein at least a portion of the first magnetic field sensor die and at least a portion of the second magnetic field sensor die are positioned within a footprint of the magnet.

15. The magnetic field sensor package of claim 11, wherein the first magnetic field sensor die and the magnet are vertically spaced at least in part by the substrate, the first magnetic field sensor die is horizontally offset relative to a center of the magnet, and the magnet is arranged such that a north pole and a south pole of the magnet are vertically aligned.

16. The magnetic field sensor package of claim 11, wherein at least a portion of the magnet is free from the molding material.

17. A magnetic position measurement system comprising:
a first target object;
a second target object disposed adjacent to the first target object; and
a magnetic field sensor package comprising:
a substrate having a front side and a back side opposite the front side
a first magnetic field sensor die mounted on the front side of the substrate;
a second magnetic field sensor die mounted on the front side of the substrate; and
a magnet disposed on the back side of the substrate, the magnet providing a bias field for the first magnetic field sensor die and the second magnetic field sensor die and an excitation field for the first target object and the second target object,
wherein the first magnetic field sensor die is positioned between the magnet and the first target object, and the first magnetic field sensor die is configured to measure a magnetic field disturbance caused by the first target object, and
wherein the second magnetic field sensor die is positioned between the magnet and the second target object, and the second magnetic field sensor die is configured to measure a magnetic field disturbance caused by the second target object.

18. The system of claim 17, wherein the sensor system comprises processing electronics configured to determine an absolute position of the first target object and the second target object using a Nonius or Vernier algorithm.

19. The system of claim 17, wherein the magnetic field sensor package further comprises an application specific integrated circuit (ASIC) die mounted on the front side of the substrate and in electrical communication with the first magnetic field sensor die.

20. The system of claim 19, wherein a molding material is disposed about the ASIC die, and the substrate comprises a lead frame.

* * * * *